United States Patent
Chen et al.

(10) Patent No.: US 6,912,107 B2
(45) Date of Patent: Jun. 28, 2005

(54) MAGNETIC ELEMENT WITH INSULATING VEILS AND FABRICATING METHOD THEREOF

(75) Inventors: Eugene Youjun Chen, Gilbert, AZ (US); Mark Durlam, Chandler, AZ (US); Saied N. Tehrani, Tempe, AZ (US); Mark DeHerrera, Tempe, AZ (US); Gloria Kerszykowski, Fountain Hills, AZ (US); Kelly Wayne Kyler, Mesa, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/830,264

(22) Filed: Apr. 21, 2004

(65) Prior Publication Data

US 2004/0197579 A1 Oct. 7, 2004

Related U.S. Application Data

(62) Division of application No. 10/349,702, filed on Jan. 22, 2003, now Pat. No. 6,835,423, which is a division of application No. 09/560,738, filed on Apr. 28, 2000, now abandoned.

(51) Int. Cl.$^7$ ................................. G11B 5/127
(52) U.S. Cl. ................ 360/324; 360/313; 360/126; 29/603.14; 29/603.15; 29/603.18; 427/130; 427/131
(58) Field of Search ................ 427/127, 128, 427/130, 131, 132, 535, 539, 123, 258, 261, 383.1, 404, 547, 598; 360/324, 126, 313; 29/603.14, 603.15, 603.18; 428/457, 900, 928, 692

(56) References Cited

U.S. PATENT DOCUMENTS

| 6,165,803 | A | * | 12/2000 | Chen et al. ................ 438/3 |
| 6,238,582 | B1 | * | 5/2001 | Williams et al. ............ 216/22 |
| 6,277,762 | B1 | * | 8/2001 | Hwang ..................... 438/714 |

* cited by examiner

*Primary Examiner*—Kirsten Jolley
(74) *Attorney, Agent, or Firm*—Ingrassia, Fisher & Lorenz, P.C.

(57) ABSTRACT

An improved and novel device and fabrication method for a magnetic element, and more particularly a magnetic element (10) including a first electrode (14), a second electrode (18) and a spacer layer (16). The first electrode (14) and the second electrode (18) include ferromagnetic layers (26 & 28). A spacer layer (16) is located between the ferromagnetic layer (26) of the first electrode (14) and the ferromagnetic layer (28) of the second electrode (16) for permitting tunneling current in a direction generally perpendicular to the ferromagnetic layers (26 & 28). The device includes insulative veils (34) characterized as electrically isolating the first electrode (14) and the second electrode (18), the insulative veils (34) including non-magnetic and insulating dielectric properties. Additionally disclosed is a method of fabricating the magnetic element (10) with insulative veils (34) that have been transformed from having conductive properties to insulative properties through oxygen plasma ashing techniques.

7 Claims, 1 Drawing Sheet

MAGNETIC ELEMENT WITH INSULATING VEILS AND FABRICATING METHOD THEREOF

CROSS-REFERENCE TO RELATED APPLICATIONS

This application is a divisional application of Ser. No. 10/349,702 filed Jan. 22, 2003, now U.S. Pat. No. 6,835,423, which is a divisional application of Ser. No. 09/560,738 filed Apr. 28, 2000 and now abandoned.

STATEMENT REGARDING FEDERALLY SPONSORED RESEARCH OR DEVELOPMENT

This invention was made with Government support under Agreement No. MDA972-96-3-0016 awarded by DARPA. The Government has certain rights in the invention.

FIELD OF THE INVENTION

The present invention relates to magnetic elements for information storage and/or sensing and a fabricating method thereof, and more particularly, to a device and method of fabricating the magnetic element to include insulative veils.

BACKGROUND OF THE INVENTION

This application is related to a co-pending application that bears Motorola docket number CR97-133 and U.S. Ser. No. 09/144,686, entitled "MAGNETIC RANDOM ACCESS MEMORY AND FABRICATING METHOD THEREOF," filed on Aug. 31, 1998, assigned to the same assignee and incorporated herein by this reference, co-pending application that bears Motorola docket number CR 97-158 and U.S. Ser. No. 08/986,764, entitled "PROCESS OF PATTERNING MAGNETIC FILMS" filed on Dec. 8, 1997, assigned to the same assignee and incorporated herein by this reference and issued U.S. Pat. No. 5,768,181, entitled "MAGNETIC DEVICE HAVING MULTI-LAYER WITH INSULATING AND CONDUCTIVE LAYERS", issued Jun. 16, 1998, assigned to the same assignee and incorporated herein by.

Typically, a magnetic element, such as a magnetic memory element, has a structure that includes ferromagnetic layers separated by a non-magnetic layer. Information is stored as directions of magnetization vectors in magnetic layers. Magnetic vectors in one magnetic layer, for instance, are magnetically fixed or pinned, while the magnetization direction of the other magnetic layer is free to switch between the same and opposite directions that are called "parallel" and "anti-parallel" states, respectively. In response to parallel and anti-parallel states, the magnetic memory element represents two different resistances. The resistance has minimum and maximum values when the magnetization vectors of the two magnetic layers point in substantially the same and opposite directions, respectively. Accordingly, a detection of change in resistance allows a device, such as an MRAM device, to provide information stored in the magnetic memory element. The difference between the minimum and maximum resistance values, divided by the minimum resistance is known as the magnetoresistance ratio (MR).

An MRAM device integrates magnetic elements, more particularly magnetic memory elements, and other circuits, for example, a control circuit for magnetic memory elements, comparators for detecting states in a magnetic memory element, input/output circuits, etc. These circuits are fabricated in the process of CMOS (complementary metal-oxide semiconductor) technology in order to lower the power consumption of the device.

During typical magnetic element fabrication, such as MRAM element fabrication, metal films are grown by sputter deposition, evaporation, or epitaxy techniques. One such magnetic element structure includes a substrate, a base electrode multilayer stack, a synthetic antiferromagnetic (SAF) structure, an insulating tunnel barrier layer, and a top electrode stack. The base electrode layer stack is formed on the substrate and includes a first seed layer deposited on the substrate, a template layer formed on the seed layer, a layer of an antiferromagnetic material on the template layer and a pinned ferromagnetic layer formed on and exchange coupled with the underlying antiferromagnetic layer. The ferromagnetic layer is called the pinned layer because its magnetic moment (magnetization direction) is prevented from rotation in the presence of an applied magnetic field. The SAF structure includes a pinned ferromagnetic layer, and a fixed ferromagnetic layer, separated by a layer of ruthenium, or the like. The top electrode stack includes a free ferromagnetic layer and a protective layer formed on the free layer. The magnetic moment of the free ferromagnetic layer is not pinned by exchange coupling, and is thus free to rotate in the presence of applied magnetic fields.

During fabrication of these magnetic elements, ion milling is commonly used for the dry etching of the magnetic materials. However, during the process of dry etching, conducting veils are left remaining on the sides of the magnetic tunnel junction (MTJ). These remaining veils lead to electrical shorting of the device between the bottom and top electrodes, more particularly across the insulating tunnel barrier. Currently, wet etching techniques are used in the semiconductor industry to etch away the veils, but are not amenable for use in conjunction with magnetic materials due to their chemical attack on the magnetic materials leading to device performance degradation.

To avoid the shorting problem caused by veils, the current etching process is done in two steps. First the top magnetic layer of the magnetic element is etched or defined, then the whole stack is etched using a dry etch technique; or vice versa. Veils may be minimized by varying the etching beam angle relative to the wafer surface. Since the edges of the top and bottom magnetic layers do not overlap, the veils do not cause a shorting problem between the top and bottom magnetic layers. However, this is a very complex etching process. Stopping the etch of the top magnetic layer without over-etching through the ultra thin tunnel barrier, and into the bottom magnetic layer is very difficult to do. Over-etching into the bottom magnetic layer will cause unwanted magnetic poles shifting the resistance-magnetic field response of the magnetic element. This technique also limits the free magnetic layer to be placed on top of the tunnel barrier.

Accordingly, it is a purpose of the present invention to provide for a magnetic element having formed as a part thereof, insulating veils, which no longer include conductive or magnetic properties.

It is a still further purpose of the present invention to provide a method of forming a magnetic element with insulating veils.

It is another purpose of the present invention to provide a method of fabricating a magnetic element that includes plasma oxygen ashing of the magnetic stack to transform conducting veils into insulating veils.

It is another purpose of the present invention to provide a method of forming a magnetic element with insulating veils which is amenable to simple and high throughput manufacturing.

It is still a further purpose of the present invention to provide a method of forming a magnetic element with insulating veils that allows for the formation of the free magnetic layer anywhere within the magnetic element stack.

SUMMARY OF THE INVENTION

These needs and others are substantially met through provision of a magnetic element including a base metal layer, a first electrode, a second electrode and a spacer layer. The base metal layer is positioned on an uppermost surface of a substrate element. A spacer layer is located between the ferromagnetic layers for permitting tunneling current in a direction generally perpendicular to the ferromagnetic layers. In an alternative embodiment, the structure is described as including a SAF structure to allow for proper balancing of magnetostatic interaction in the magnetic element. The device includes insulative veils characterized as electrically isolating the first electrode and the second electrode, the insulative veils including non-magnetic and insulating dielectric properties. Additionally disclosed is a method of fabricating the magnetic element with insulative veils that have been transformed from having conductive properties to having insulative properties through oxygen plasma ashing techniques.

DETAILED DESCRIPTION OF THE PREFERRED EMBODIMENTS

Figure 1:
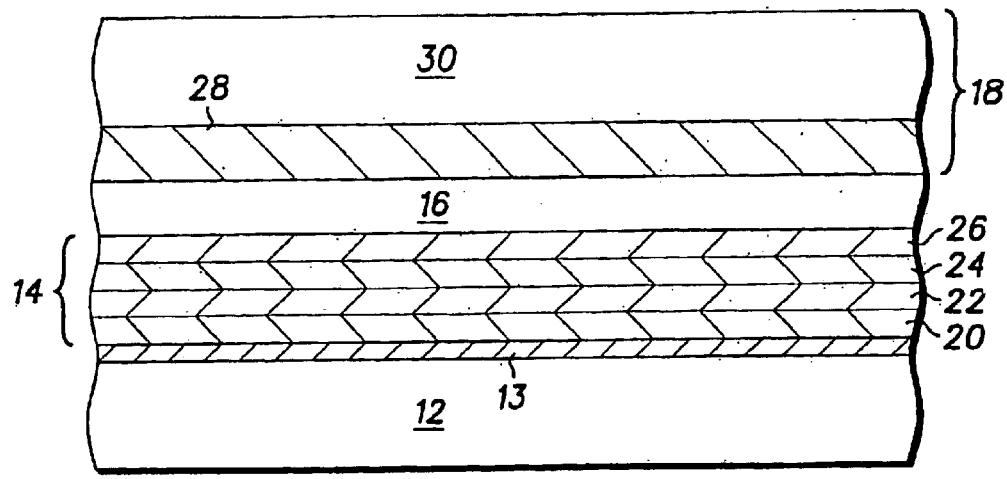
FIGS. 1–3 illustrate in cross-sectional views, the steps in fabricating a magnetic element with insulative veils according to the present invention.
Figure 2:
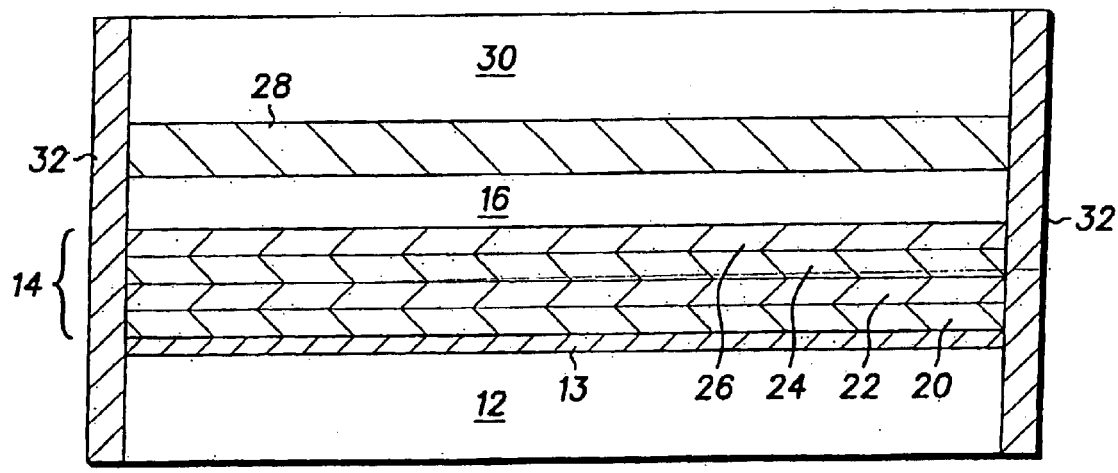
Figure 3:
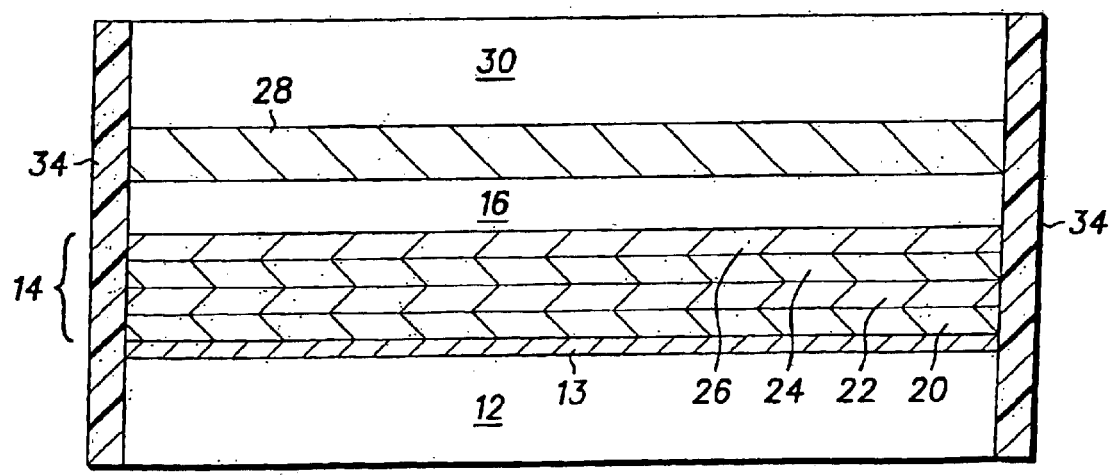

During the course of this description, like numbers are used to identify like elements according to the different figures that illustrate the invention. FIGS. 1–3 illustrate in cross-sectional views a magnetic element according to the present invention. More particularly, illustrated in FIG. 1, is a first step in the fabrication of a patterned magnetic element 10. Illustrated in FIG. 1, is a fully patterned magnetic element structure 10. The structure includes a substrate 12, a first electrode multilayer stack 14, a spacer layer 16 including oxidized aluminum, and a second electrode multilayer stack 18. It should be understood that spacer layer 16 is formed dependent upon the type of magnetic element being fabricated. More particularly, in a MTJ structure, spacer layer 16 is formed of a dielectric material, and in a spin valve structure, spacer layer 16 is formed of a conductive material. First electrode multilayer stack 14 and second electrode multilayer stack 18 include ferromagnetic layers. First electrode layers 14 are formed on a base metal layer 13, which is formed on substrate 12. Base metal layer 13 is disclosed as composed of a single metal material or layer or a stack of more than one metal material or layer. First electrode layer 14 includes a first seed layer 20, deposited on base metal layer 13, a template layer 22, a layer of antiferromagnetic pinning material 24, and a fixed ferromagnetic layer 26 formed on and exchange coupled with the underlying antiferromagnetic pinning layer 24. It should be understood that anticipated by this disclosure is a pseudo spin-valve structure that would not include the antiferromagnetic pinning layer. In this instance, the pseudo spin-valve structure would include a first electrode and a second electrode including a first switching field and a second switching field thereby defining the pseudo spin-valve structure.

Typically, seed layer 20 is formed of tantalum nitride (TaNx) having template layer 22 formed thereon. Template layer 22 in this particular embodiment is formed of ruthenium (Ru). Pinning layer 24 is typically formed of iridium manganese (IrMn).

In this particular embodiment, ferromagnetic layer 26 is described as fixed, or pinned, in that its magnetic moment is prevented from rotation in the presence of an applied magnetic field. Ferromagnetic layer 26 is typically formed of alloys of one or more of the following: nickel (Ni), iron (Fe), and cobalt (Co).

Second electrode stack 18 includes a free ferromagnetic layer 28 and a protective contact layer 30. The magnetic moment of the free ferromagnetic layer 28 is not fixed, or pinned, by exchange coupling, and is free to rotate in the presence of an applied magnetic field. Free ferromagnetic layer 28 is typically formed of a nickel iron (NiFe) alloy or a nickel iron cobalt (NiFeCo) alloy. It should be understood that a reversed, or flipped, structure is anticipated by this disclosure. More particularly, it is anticipated that the disclosed magnetic element can be formed to include a top fixed, or pinned layer, and thus described as a top pinned structure. In addition, a device including dual spacer layers is anticipated by this structure. In this instance, magnetic element 10 would structurally include a bottom pinned magnetic layer, a bottom spacer, or tunnel barrier layer, a free magnetic layer, a top spacer, or tunnel barrier layer, and a top pinned magnetic layer. The bottom pinned magnetic layer, the free magnetic layer and the top pinned magnetic layer include ferromagnetic layers. The bottom magnetic layer is optionally formed on a diffusion barrier layer which is formed on a metal lead which in turn is typically formed on some type of dielectric material. The diffusion barrier layer is typically formed of tantalum nitride (TaN), and aids in the thermal stability of the magnetic element.

Fixed ferromagnetic layer 26 is described as pinned, or fixed, in that its magnetic moment is prevented from rotation in the presence of an applied magnetic field. Ferromagnetic layer 26 as previously stated is typically formed of alloys of one or more of the following: nickel (Ni), iron (Fe), and cobalt (Co). Magnetic layer 28 is described as a free ferromagnetic layer. Accordingly, the magnetic moment of free ferromagnetic layer 28 is not fixed, or pinned, by exchange coupling, and is free to rotate in the presence of an applied magnetic field. Free ferromagnetic layer 28 is formed co-linear with fixed magnetic layer 26 and of alloys of one or more of the following: nickel (Ni), iron (Fe), and cobalt (Co). Fixed ferromagnetic layer 26 is described as having a thickness within a range of 5–500 Å. Free ferromagnetic layer 28 is described as having a thickness generally in the range of 5–500 Å.

In this particular embodiment, spacer layer 16 is formed of aluminum (Al) and oxygen (O). More particularly, spacer layer 16 is formed having a general formula of $AlO_x$, where $0 < x \leq 1.5$. It should be understood that when device 10 includes dual spacer layers, as previously discussed, that the second spacer layer would be formed of oxidized tantalum (Ta), generally having the formula $TaO_x$, where $0 < x \leq 2.5$.

Illustrated in FIG. 2, the next step in the method of fabricating device 10 according to the present invention. More particularly, as illustrated, the plurality of epitaxially deposited layers are etched to define device 10 having included as a part thereof conductive veils 32. Conductive veils 32 are formed subsequent to ion milling or reactive ion etching which is utilized to form device 10. Conductive veils 32 provide an electrical path between first electrode 14 and second electrode 18 and thereby cause device 10 to fail, due to the shorting out of the device across insulative spacer layer 16. Typically these veils are etched off utilizing a wet etch process, which causes degraded device performance, and thus not suitable for MRAM device fabrication. In addition, wet etching away conductive veils 32 is hard to utilize for deep submicron features, results in a non-uniform lateral over-etch, causing switching fields to vary, and results in an inability to make every cell the same shape and having the same switching field.

Referring now to FIG. 3, illustrated is the next step in the method of fabricating device 10 according to the present invention. More particularly, as illustrated, conductive veils 32 are next dry etched, using oxygen plasma ashing at either room temperature, more particularly at temperature of 150° C., or a higher temperature. This oxygen plasma etching of conductive veils 32 provides for the transformation of conductive veils 32 into insulative veils 34. Insulative veils 34 are thus described as inactive having non-magnetic, dielectric properties. The fabrication of insulative veils 32 results in a device having electrically isolated, first electrode 14 and second electrode 18;

It should be understood that due to the ability to electrically isolate first electrode 14 and second electrode 18, that free magnetic layer 28 can be formed anywhere in device 10. Prior art dictates the fabrication of the free magnetic layer on the top of the device stack due to its fabrication as a thin layer, and the ability to turn portions of it into a dielectric material, thus electrically isolating the electrodes. This transformation of the thin free magnetic layer as disclosed and claimed herein provides for the blocking of the conduction path through the naturally formed conductive veil between the first electrode and the second electrode. In this particular invention, in that the conductive veils have been transformed into insulative veils 34, free magnetic layer 28 can be formed anywhere in the device stack. It should be understood that it is anticipated by this disclosure that device 10 may include a synthetic antiferromagnetic (SAF) structure that is formed between two tunnel barrier, or spacer, layers, or alternatively below a first spacer or tunnel barrier layer, or on a surface of a top spacer or tunnel barrier layer.

Thus, a magnetic element with insulative veils and fabricating method thereof is disclosed in which the device structure and method of fabricating the device is improved based on the transformation of conductive veils to insulative veils. As disclosed, this technique can be applied to devices using patterned magnetic elements, such as magnetic sensors, magnetic recording heads, magnetic recording media, or the like. Accordingly, such instances are intended to be covered by this disclosure

What is claimed is:

1. A magnetic element comprising:
    a first electrode including a ferromagnetic layer;
    a second electrode spaced apart from the first electrode, the second electrode including a ferromagnetic layer;
    a spacer layer located between the ferromagnetic layer of the first electrode and the ferromagnetic layer of the second electrode; and
    an insulative veil electrically isolating the first electrode and the second electrode, the insulative veil having been formed from a conductive material by etching using an oxygen plasma ashing.

2. A magnetic element as claimed in claim 1 wherein the ferromagnetic layers of the first electrode and the second electrode include in combination a fixed ferromagnetic layer and a free ferromagnetic layer, the fixed ferromagnetic layer having a magnetization that is fixed in a preferred direction in the presence of an applied magnetic field capable of switching the free layer, and the free ferromagnetic layer having a magnetization that is free to rotate between magnetization states in the presence of an applied magnetic field.

3. A magnetic element as claimed in claim 1 wherein the free ferromagnetic layer and the fixed ferromagnetic layer include at least one of NiFe, NiFeCo, CoFe, or Co.

4. A magnetic element as claimed in claim 1 wherein the ferromagnetic layers of the first electrode and the second electrode include a first switching field and a second switching field thereby defining a pseudo spin-valve structure.

5. A magnetic element as claimed in claim 1 wherein the insulative veil is formed of an inactive material.

6. A magnetic element as claimed in claim 5 wherein the insulative veil is formed of a dielectric material.

7. A magnetic element as claimed in claim 1 wherein the spacer layer includes one of a dielectric material defining a MTJ structure or a conductive material defining a spin valve structure.

* * * * *